(12) United States Patent
Zeng et al.

(10) Patent No.: US 11,431,116 B2
(45) Date of Patent: Aug. 30, 2022

(54) TERMINAL AND ELECTRONIC DEVICE HAVING THE SAME

(71) Applicant: Delta Electronics (Shanghai) Co., Ltd., Shanghai (CN)

(72) Inventors: Chen Zeng, Shanghai (CN); Yukun Wu, Shanghai (CN); Yufei Liu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 78 days.

(21) Appl. No.: 17/024,714

(22) Filed: Sep. 18, 2020

(65) Prior Publication Data

US 2021/0249800 A1   Aug. 12, 2021

(30) Foreign Application Priority Data

Feb. 12, 2020   (CN) .......................... 202010088679.X

(51) Int. Cl.
| | |
|---|---|
| *H01R 12/58* | (2011.01) |
| *H01F 27/06* | (2006.01) |
| *H01F 27/29* | (2006.01) |
| *H01R 4/34* | (2006.01) |
| *H01R 12/51* | (2011.01) |
| *H05K 1/18* | (2006.01) |

(52) U.S. Cl.
CPC ............. *H01R 12/58* (2013.01); *H01F 27/06* (2013.01); *H01F 27/29* (2013.01); *H01R 4/34* (2013.01); *H01R 12/515* (2013.01); *H05K 1/184* (2013.01); *H05K 2201/10613* (2013.01)

(58) Field of Classification Search
CPC ......... H01R 11/00; H01R 11/03; H01R 11/05; H01R 11/26; H01R 12/58; H01R 12/515; H01R 4/34; H01F 27/06; H01F 27/29; H05K 1/184; H05K 2201/10613
See application file for complete search history.

(56) References Cited

U.S. PATENT DOCUMENTS

| | | | | |
|---|---|---|---|---|
| 3,636,502 | A * | 1/1972 | Wallace ................... | H01R 4/32 439/626 |
| 5,666,099 | A * | 9/1997 | Ostrem ................... | H01F 27/29 336/107 |
| 9,468,120 | B2 * | 10/2016 | Lu ............................ | H01R 4/34 |

(Continued)

FOREIGN PATENT DOCUMENTS

| | | |
|---|---|---|
| CN | 1219012 A | 6/1999 |
| CN | 2583784 Y | 10/2003 |

(Continued)

*Primary Examiner* — Oscar C Jimenez
(74) *Attorney, Agent, or Firm* — CKC & Partners Co., LLC

(57) ABSTRACT

The invention discloses a terminal and an electronic device having the same. The terminal includes a connecting part, a mounting part, and a fixing part along an insertion direction, wherein the connecting part is adapted to be connected to a jump wire of an electronic component, the mounting part has an outer profile matching with at least a portion of an inner profile of an insertion hole in a base, for restricting displacement of the terminal after being inserted into the insertion hole, and the fixing part is adapted to be threadedly connected with the a fixing member so as to connect the fixing part to a circuit board.

20 Claims, 15 Drawing Sheets

(56) References Cited

U.S. PATENT DOCUMENTS

2016/0230800 A1* 8/2016 Sawai .................... F16B 37/04
2019/0371509 A1* 12/2019 Lee ......................... H01R 4/50

FOREIGN PATENT DOCUMENTS

| | | |
|---|---|---|
| CN | 202395178 U | 8/2012 |
| CN | 203013962 U | 6/2013 |
| CN | 104684293 A | 6/2015 |
| CN | 204424503 U | 6/2015 |
| CN | 106129751 A | 11/2016 |
| CN | 104684293 B | 10/2017 |
| CN | 107770960 A | 3/2018 |
| CN | 207885032 U | 9/2018 |
| CN | 109713531 A | 5/2019 |
| CN | 110556236 A | 12/2019 |
| CN | 209804937 U | 12/2019 |
| DE | 20114593 U1 | 1/2002 |

* cited by examiner

TERMINAL AND ELECTRONIC DEVICE HAVING THE SAME

CROSS-REFERENCE TO RELATED APPLICATIONS

This non-provisional application claims priority under 35 U.S.C. § 119(a) on Patent Application No. 202010088679.X filed in P. R. China on Feb. 12, 2020, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the present invention described herein. All references listed, cited and/or discussed in this specification are incorporated herein by reference in their entireties and to the same extent as if each reference was individually incorporated by reference.

FIELD OF THE INVENTION

The present invention relates to a terminal and an electronic device having the same, particularly to a direct plug-in terminal and an electronic device having the same.

BACKGROUND OF THE INVENTION

With the development of electronic techniques, application of jump wire terminals becomes more and more extensive. For example, Chinese patent CN104684293B discloses a terminal. As shown in FIGS. 1A-1C, the terminal 30' is welded to a jump wire 11' of a magnetic component 10' through one end 33' thereof, and then assembled with a base 20'. During fitting, a nut 52' is placed in a fastening hole 22' in the base 20'. The other end 31' of the terminal 30' needs to firstly hook to a mounting hole 21' in the base 20', and then rotate a certain angle to be clamped into the base 20' in such a way that a fixing holes 32' in the rotated terminal 30' is at a position corresponding to the fastening holes 22' in the base 20' and the nut 52' within the fastening holes 22', as shown in FIGS. 1B and 1C. Then, a PCB board 40' and the base 20' can be fixed by using bolts 51'. Although such kind of terminal 30' may facilitate connection of the jump wire 11' of the magnetic component 10' to the PCB board 40', due to the requirement for a rotation space for the terminal, has drawbacks of large occupied space and inconvenient mounting, thereby causing problems of increased volume, increased cost, inconvenient mounting of the magnetic component 10', and the like.

SUMMARY OF THE INVENTION

An objective of the invention is to provide a terminal and an electronic device having the same, which can overcome one or more drawbacks in the prior art.

To realize the above objective, the invention provides a terminal including a connecting part, a mounting part, and a fixing part arranged along an insertion direction, wherein the connecting part is adapted to be connected to a jump wire of an electronic component, the mounting part has an outer profile matching with at least a portion of an inner profile of an insertion hole in a base, for restricting displacement of the terminal after being inserted into the insertion hole, and the fixing part is adapted to be threadedly connected with the a fixing member so as to connect the fixing part to a circuit board.

In one aspect, the electronic component is mounted on the base, and the base is mounted on the circuit board, wherein the connecting part, the mounting part, the fixing part, and the fixing member are made of conductive materials, and wherein the terminal electrically connects and fixes the jump wire to the circuit board.

In one aspect, the connecting part, the mounting part and the fixing part are formed as an integrated column structure.

In one aspect, the electronic component is a transformer, and the jump wire of the electronic component is an lead wire of the transformer.

In one aspect, the insertion hole includes a connecting section, a mounting section, and a fixing section for accommodating the connecting part, the mounting part and the fixing part, respectively. The connecting section has a first block suitable for being interfered with the mounting part to restrict the terminal inserted into the insertion hole from sliding out, the mounting section has a second block suitable for being interfered with the mounting part to restrict the terminal inserted into the insertion hole from passing through the insertion hole, and the outer profile of the mounting part matches with an inner profile of the mounting section of the insertion hole.

In one aspect, the first block has a chamfer at one end adjacent to an inlet of the insertion hole.

In one aspect, the outer profile of the mounting part has a larger size than that of outer profiles of the fixing part and the connecting part.

In one aspect, the outer profile of the mounting part is of a polygonal shape to restrict rotating displacement of the terminal inserted into the insertion hole.

In one aspect, the mounting part includes a first sub-mounting part and a second sub-mounting part detachably connected with each other, wherein the first sub-mounting part is connected to the connecting part, and the second sub-mounting part is connected to the fixing part.

In one aspect, the first sub-mounting part and the second sub-mounting part are detachably connected with each other by matching a projection having an external thread with a recess having an internal thread, wherein the projection is disposed on one of the first sub-mounting part and the second sub-mounting part, and the recess is disposed on the other of the first sub-mounting part and the second sub-mounting part correspondingly to the projection.

In one aspect, the fixing part has a first internal thread, and the fixing member has a first external thread for matching with the first internal thread, the fixing member passes through a fixing hole in the circuit board and is connected with the fixing part by matching the first external thread with the first internal thread; or the fixing part has a second external thread, and the fixing member has a second internal thread for matching with the second external thread, the fixing part passes through a fixing hole in the circuit board and is connected with the fixing member by matching the second external thread with the second internal thread.

In one aspect, the jump wire is inserted into the connecting part from a bottom surface of the connecting part in a direction parallel to the insertion direction; or the jump wire is inserted into the connecting part from a side surface of the connecting part in a direction perpendicular to the insertion direction.

In one aspect, the connecting part and the jump wire are welded or pressure connected with each other.

In one aspect, an outer profile of the connecting part is of round shape, and a sidewall of the connecting part is provided with a slot.

To realize the above object, the invention further provides an electronic device, including a base provided with at least one insertion hole; an electronic component mounted on the base; a circuit board provided with at least one fixing hole correspondingly to the at least one insertion hole; at least one fixing member; and at least one terminal directly inserted into the corresponding insertion hole. The terminal includes a connecting part, a mounting part, and a fixing part arranged along an insertion direction, wherein the connecting part is adapted to be connected to a jump wire of an electronic component, the mounting part has an outer profile matching with at least a portion of an inner profile of an insertion hole in a base, for restricting displacement of the terminal after being inserted into the insertion hole, and the fixing part is adapted to be threadedly connected with the a fixing member so as to connect the fixing part to a circuit board. One of the fixing member and the fixing part passes through the fixing hole in the circuit board, matches and is connected with the other one of the fixing member and the fixing part, so that the base is fixed to the circuit board to electrically connect and fix the jump wire of the electronic component to the circuit board through the terminal.

The direct plug-in terminal according to the present invention can be directly inserted into the base along an insertion direction and conveniently connected to the jump wire of the electronic component, allowing the circuit board and the base to be conveniently assembled together through the fixing members. The terminal according to the present invention not only can be mounted conveniently, but also has a small occupied space, thereby realizing the objective of reducing a volume of the electronic device.

The additional aspects and advantages of the invention are partially explained in the below description, and partially becoming apparent from the description, or can be obtained through practice of the invention.

BRIEF DESCRIPTION OF THE DRAWINGS

The exemplary embodiments will be described in detail with reference to the accompanying drawings, through which the above and other objects, features and advantages of the invention will become more apparent.

DETAILED EMBODIMENTS OF THE INVENTION

Figure 1A:
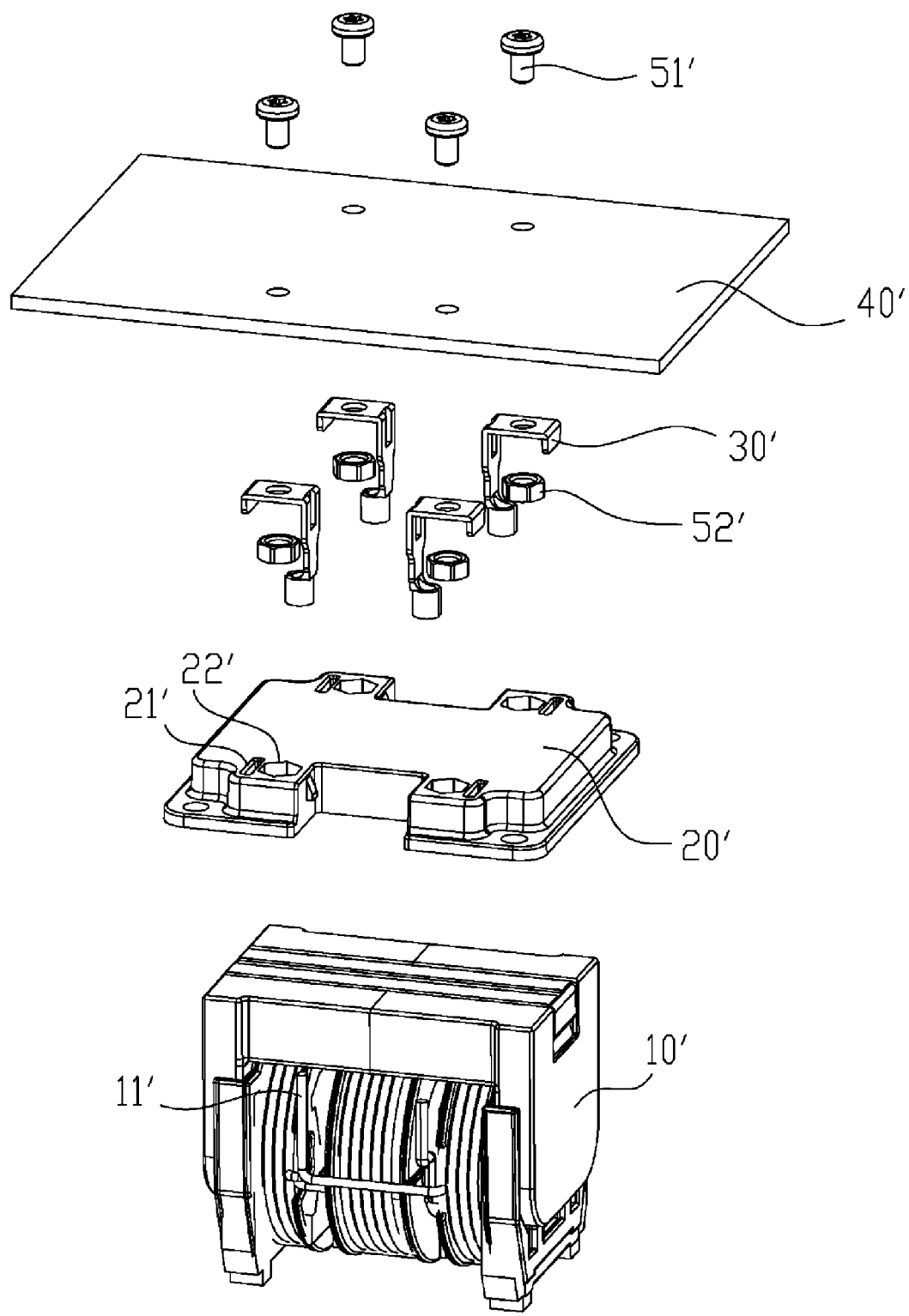
FIG. 1A is an explored perspective view of the magnetic component before assembled in the prior art.
Figure 1B:
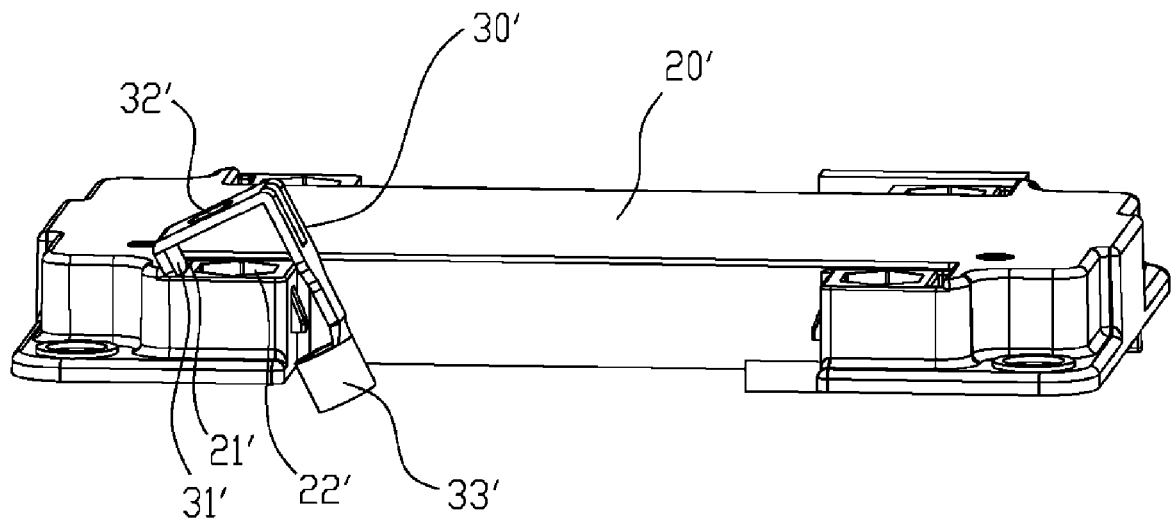
FIG. 1B is a perspective view showing the base and the terminal of the magnetic component during the rotating assembly in the prior art.
Figure 1C:
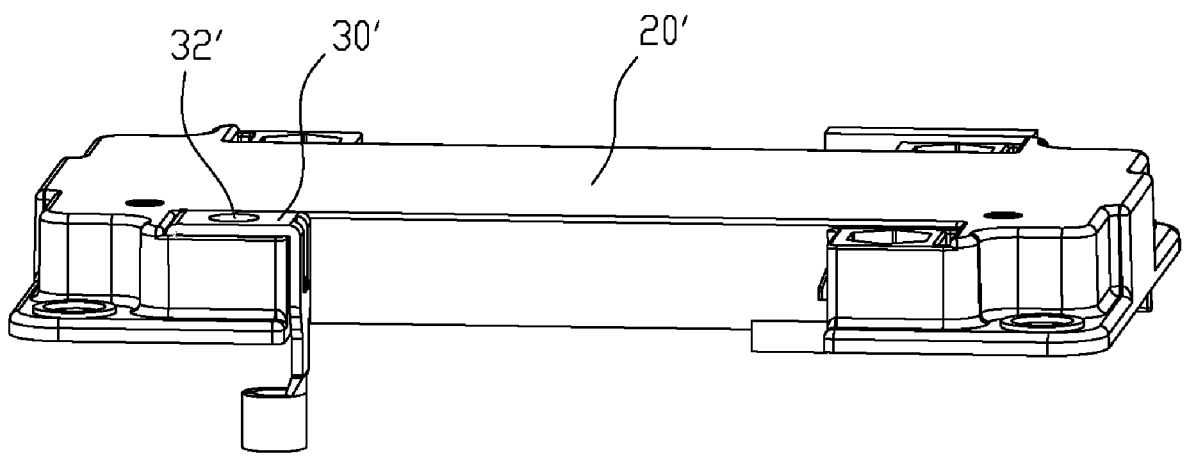
FIG. 1C is a perspective view showing the base and the terminal in FIG. 1B after assembled.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that this invention will be thorough and complete, and the conception of exemplary embodiments will be fully conveyed to those skilled in the art. In the drawings, the same reference numeral denotes the same or similar structure, so their detailed description will be omitted.

When factors/components/the like described and/or illustrated here are introduced, the phrases "one", "a(an)", "the", "said" and "at least one" refer to one or more factors/components/the like. The terms "include", "comprise" and "have" refer to an open and included meaning, and refer to additional factors/components/the like, in addition to the listed factors/components/the like. The embodiments may use relative phrases, such as, "upper" or "lower" to describe a relative relation of one signed component over another component. It should be understood that if the signed device reverses to turn upside down, the described component on an "upper" side will become a component on a "lower" side. In addition, the terms "first", "second" and the like in the claims are only used as signs, instead of numeral limitations to objects.

Aiming at issues of a large occupied space and inconvenient mounting for the existing terminal, the present invention provides a direct plug-in terminal, which is suitable for application in various electronic devices, realizing the objective of reducing a volume of the electronic device.

Figure 2:
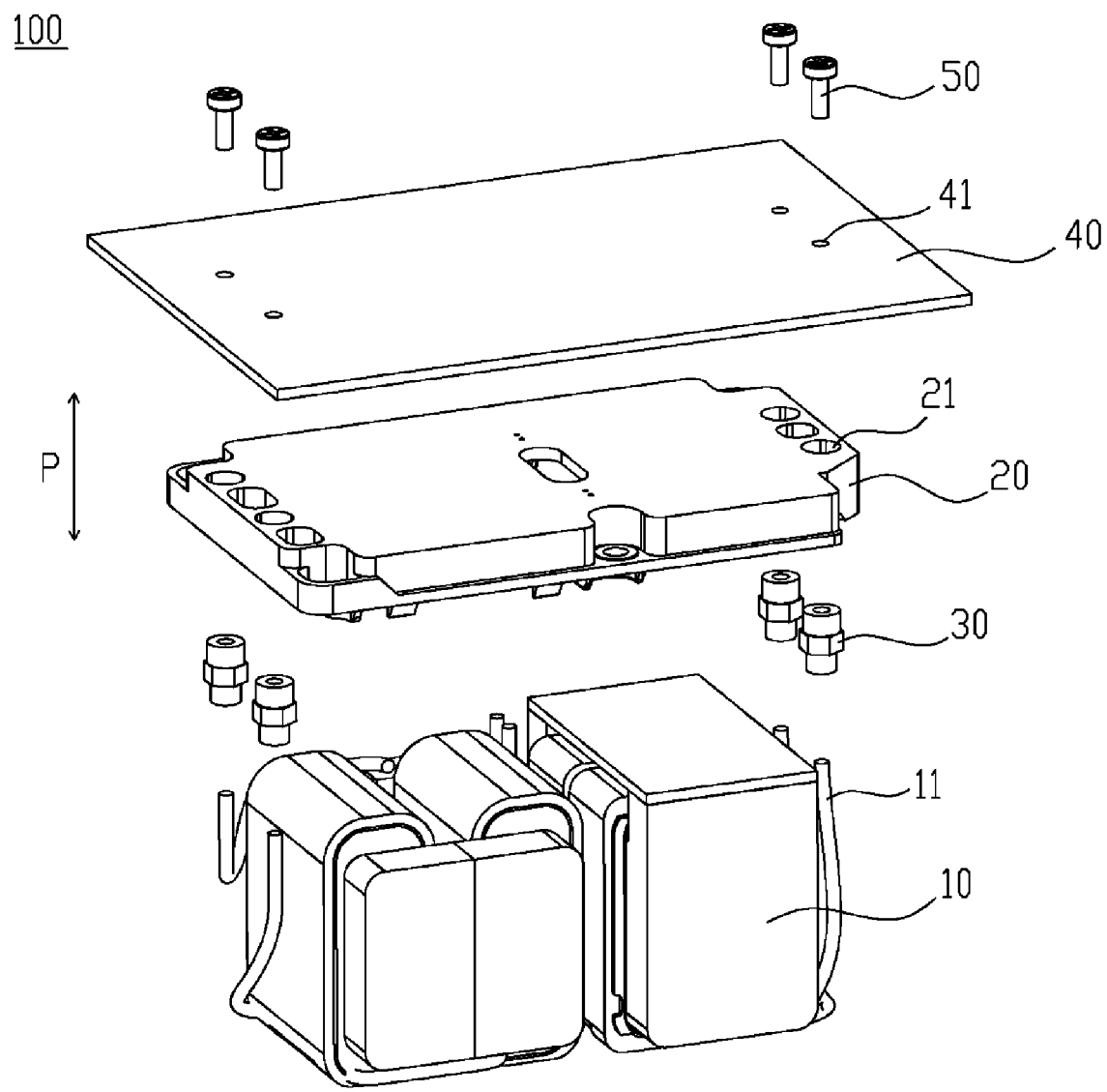
FIG. 2 is an explored perspective view of the electronic device before assembled according to one embodiment of the invention, with the direct plug-in terminal of the invention to be directly inserted and mounted along the insertion direction.

As shown in FIG. 2, an electronic device 100 provided in one embodiment of the invention includes, for example, an electronic component 10, a base 20, a plurality of direct plug-in terminals 30, a circuit board 40, and a plurality of fixing members 50. The electronic component 10 is mounted onto the base 20. The base 20 is provided with a plurality of insertion holes 21. The circuit board 40 is provided correspondingly with a plurality of fixing holes 41. The direct plug-in terminals 30 are directly inserted into the corresponding insertion holes 21 along an insertion direction P (e.g., an up and down direction shown in FIG. 2). The fixing members 50 pass through the fixing holes 41 in the circuit board 40, and are mated and connected with the fixing parts of the terminals 30, so that the base 20 can be fixed onto the circuit board 40, and that a jump wire 11 of the electronic component 10 can be electrically connected and fixed to the circuit board 40 through the terminals 30. In this embodiment, the electronic component 10 can be, for example but not limited to, a transformer, and the jump wire 11 of the electronic component 10 can be an lead wire of the transformer. Of course, it should be understood that in other embodiment, the electronic component 10 also can be other electronic component. Additionally or alternatively, the fixing parts of the terminals 30 may pass through the fixing holes 41 in the circuit board 40 and be mated and connected with the fixing members 50 so as to fix the base 20 onto the circuit board 40, although the invention is not limited thereto.

Figure 3A:
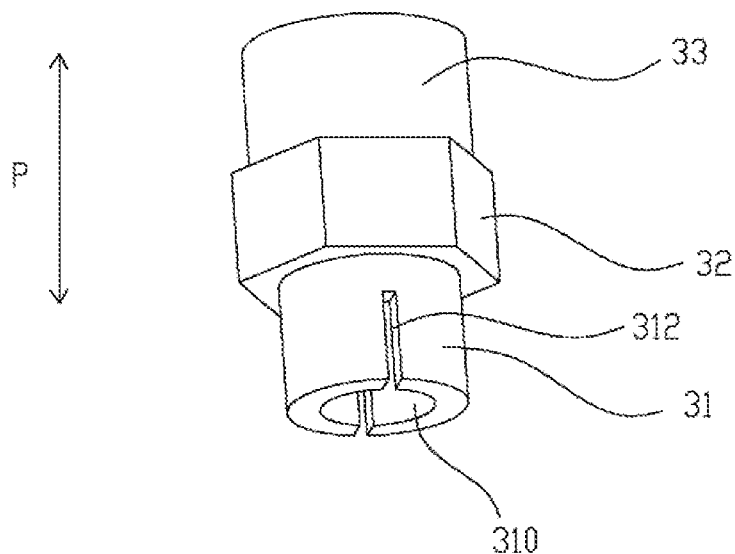
FIG. 3A is a perspective view of the terminal according to an embodiment of the invention.
Figure 3B:
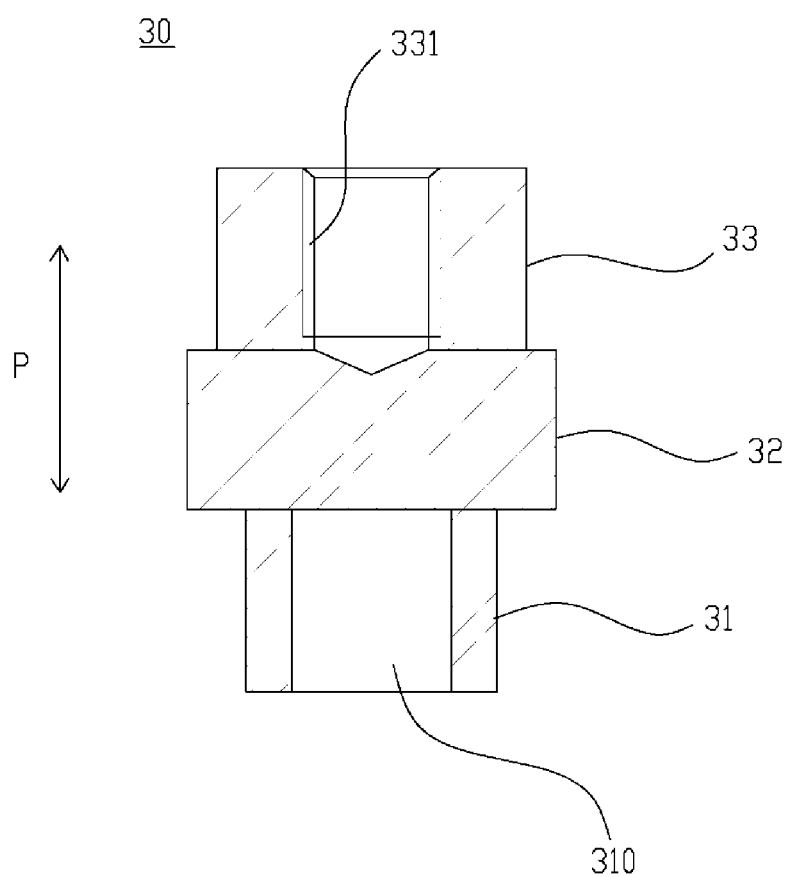
FIG. 3B is a sectional view of the terminal in FIG. 3A.

Now referring to FIGS. 3A-3B with the reference of FIG. 2, which illustrate the structure of a direct plug-in terminal 30 according to one embodiment of the invention. In this embodiment, the terminal 30 includes a connecting part 31, a mounting part 32, and a fixing part 33 arranged along the insertion direction P. The connecting part 31 is connected to the jump wire 11 of the electronic component 10. The mounting part 32 has an outer profile, which matches with at least a portion of the inner portion of the insertion hole 21 in the base 20, and limits displacement of the terminal 30 after being inserted into the insertion hole 21. The fixing part 33 and fixings member 50 are connected through threads, and connect the fixing part 33 to the circuit board 40. For example, the fixing part 33 may have a first internal thread 331 (as shown in FIG. 3B), while the fixing members 50 (such as bolts or screws) may have a first external thread (not shown) matching with the first internal thread 331. The fixing member 50 passes through the fixing hole 41 on the circuit board 40, matches and is threadedly connected with the fixing part 33.

In an embodiment, the connecting part 31, the mounting part 32, the fixing part 33 and/or the fixing members 50 may be made of conductive materials. The terminal 30 may electrically connect and fix the jump wire 11 of the electronic component 10 to the circuit board 40.

As shown in FIG. 3A, in this embodiment, the connecting part 31, the mounting part 32 and the fixing part 33 may be configured as an integrated column structure. The connecting part 31 may have a round external profile. Sidewall of the connecting part 31 may be provided with a slot 312 for observing the welding effect of the jump wire 11 within the connecting part 31. The outer profile of the mounting part 32 may be of a polygonal shape, for example but not limited to hexagonal shape, so as to restrict the rotating displacement of the terminal 30 inserted into the insertion hole 21. The fixing part 33 may have a round external profile.

Figure 3C:
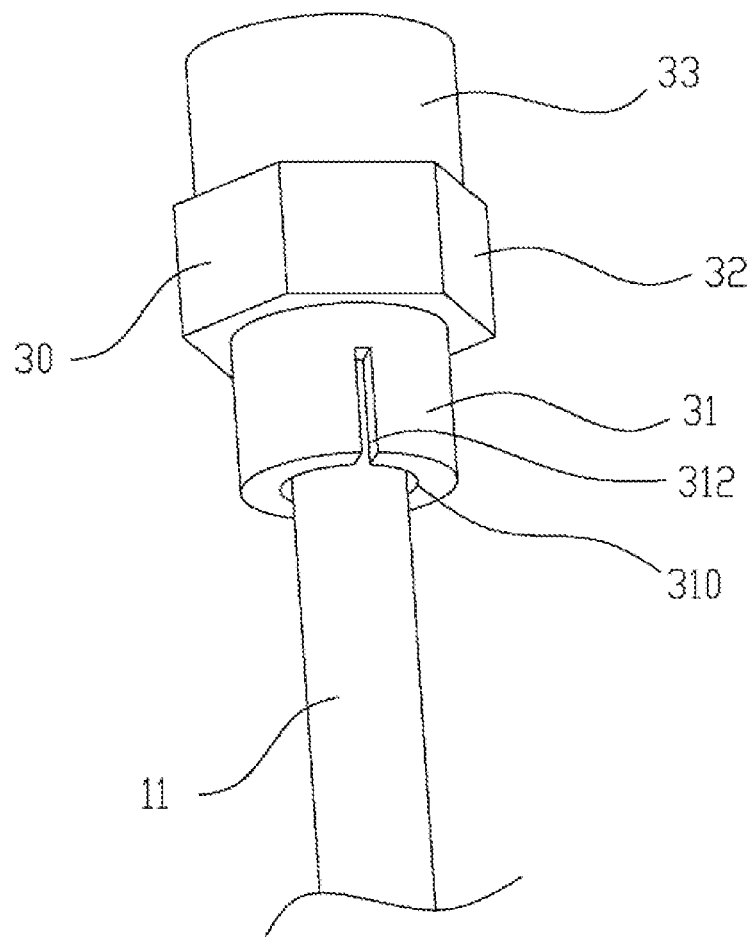
FIG. 3C is a perspective view showing the jump wire inserted into the connecting part from the bottom surface of the connecting part of the terminal shown in FIG. 3A in a direction parallel to the insertion direction, and connected thereto.
Figure 4A:
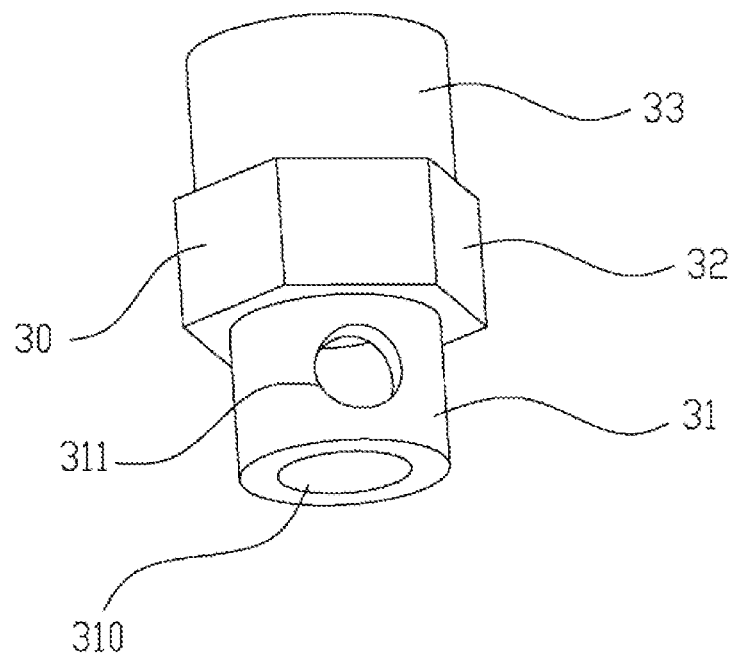
FIG. 4A is a perspective view of the terminal according to another embodiment of the invention, showing the bottom connection hole in the bottom surface of the connecting part of the terminal and the side connection hole in the side surface of the connecting part of the terminal.
Figure 4B:
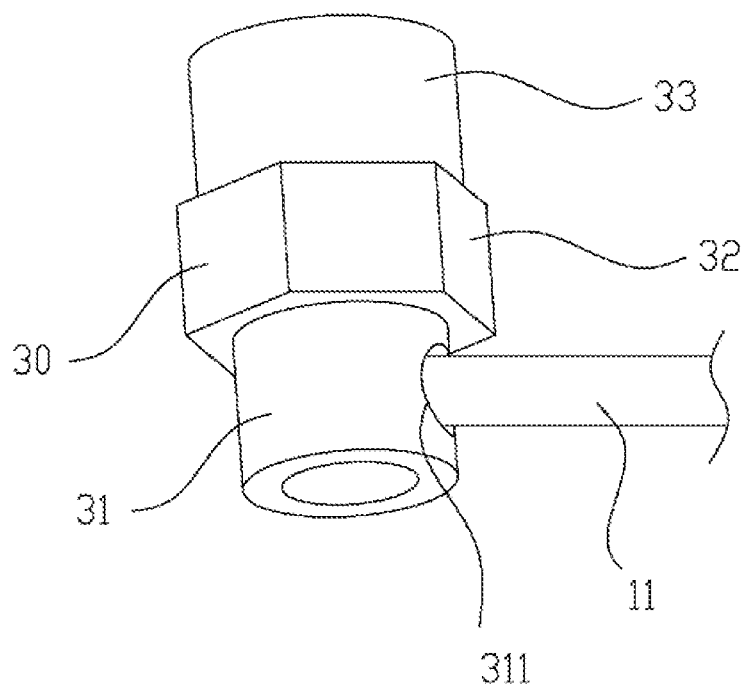
FIG. 4B is a perspective view showing the jump wire inserted into the connecting part from the side surface of the connecting part of the terminal shown in FIG. 4A in a direction perpendicular to the insertion direction, and connected thereto.

As shown in FIGS. 3A and 3C, the jump wire 11 for example is inserted in a direction parallel to the insertion direction, from a bottom surface of the connecting part 31, through a bottom connection hole 310, and into the connecting part 31. In other embodiment, as shown in FIGS. 4A and 4B, the connecting part 31 of the terminal 30 can include a side connection hole 311 provided on a side surface. Thereby, the jump wire 11 may be alternatively inserted into the connecting part 31 from the side connection hole 311 in the side surface of the connecting part 31 in a direction perpendicular to the insertion direction. Of course, it should be understood that, in other embodiment, the connecting part 31 of the terminal 30 may include both the bottom connection hole 310 in the bottom surface and the side connection hole 311 in the said surface. Thus, one can select to connect the jump wire 11 either parallelly to the insertion direction as shown in FIG. 3C or a perpendicularly to the insertion direction as shown in FIG. 4B, depending on actual requirements. In an embodiment, the connecting part 31 and the jump wire 11 can be welded or pressure connected.

Figure 5A:
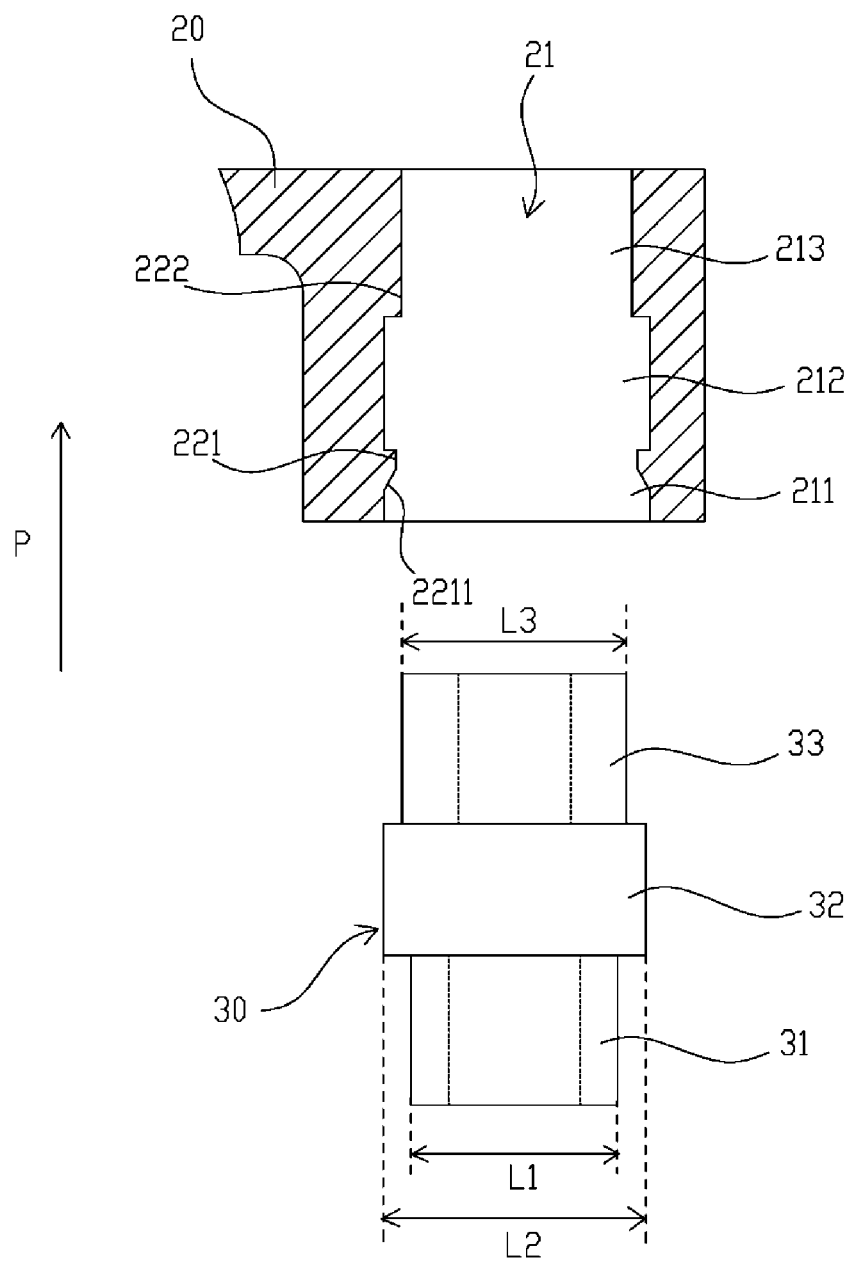
FIG. 5A is a sectional view showing the terminal and the insertion hole in the base before insertion according to an embodiment of the invention.
Figure 5B:
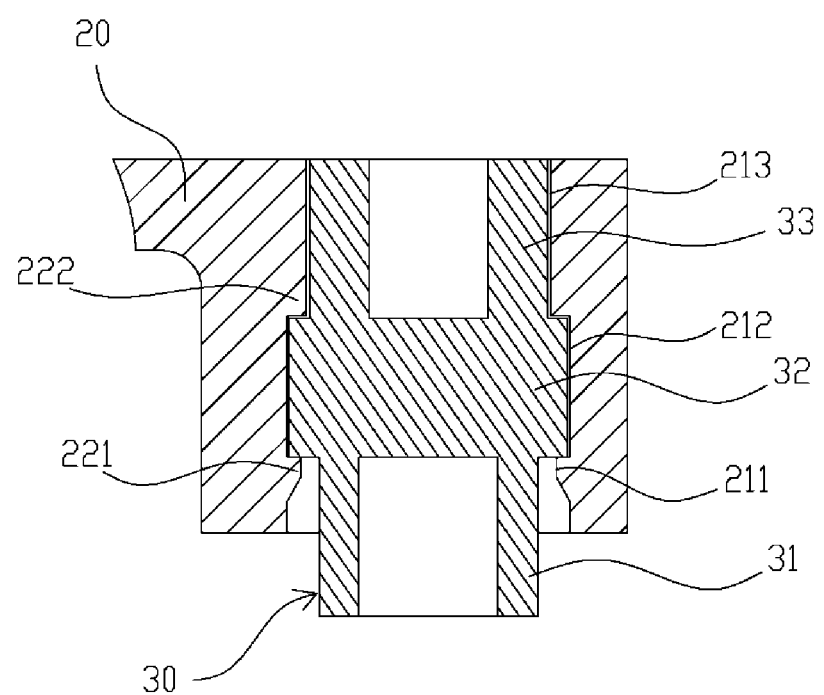
FIG. 5B is a sectional view showing the terminal in FIG. 5A after inserted into the insertion hole in the base according to an embodiment of the invention.

In an embodiment, as shown in FIGS. 5A-5B, corresponding to the terminal 30, the insertion hole 21 in the base 20 includes a connecting section 211, a mounting section 212, and a fixing section 213 for accommodating the connecting part 31, the mounting part 32, and the fixing part 33, respectively. Moreover, the connecting section 211 is further provided with a first block 221 suitable for being interfered with the mounting part 32 to restrict the terminal 30 inserted into the insertion hole 21 from sliding out. The fixing section 213 is further provided with a second block 222, which is suitable for being interfered with the mounting part 32 to restrict the terminal 30 inserted in the insertion hole 21 from passing through the insertion hole 21.

In an embodiment, the outer profile of the mounting part 32 of the terminal 30 is configured to match with the inner profile of the mounting section 212 of the insertion hole 21 of the base 20, for example a hexagonal shape. Moreover, the outer profile of the mounting part 32 has larger size than that of the outer profile of the fixing part 33 and the outer profile of the connecting part 31. For example, the outer diameter L2 of the mounting part 32 is larger than the outer diameter L3 of the fixing part 33 and the outer diameter L1 of the connecting part 31.

In this embodiment, the first block 221 has a chamfer 2211 at the end adjacent to the inlet of the insertion hole 21. When the terminal 30 is inserted into the insertion hole 21 of the base 20 from bottom to top along the insertion direction P shown in FIG. 5A, the chamfer 2211 may facilitate the insertion of the terminal 30. When the terminal 30 is inserted into the insertion hole 21, as shown in FIG. 5B, the terminal 30 is prevented from sliding out through the interference between the first block 221 and the second block 22 with the mounting part 32 of the terminal 30. Moreover, after insertion of the terminal 30 into the base 20, the outer profile of the mounting part 32 of the terminal 30 matches with the inner profile of the mounting section 212 of the insertion hole 21 to restrict the rotating displacement of the terminal 30 with respect to the base 20, so that the position of the terminal 30 can be fixed.

Figure 6A:
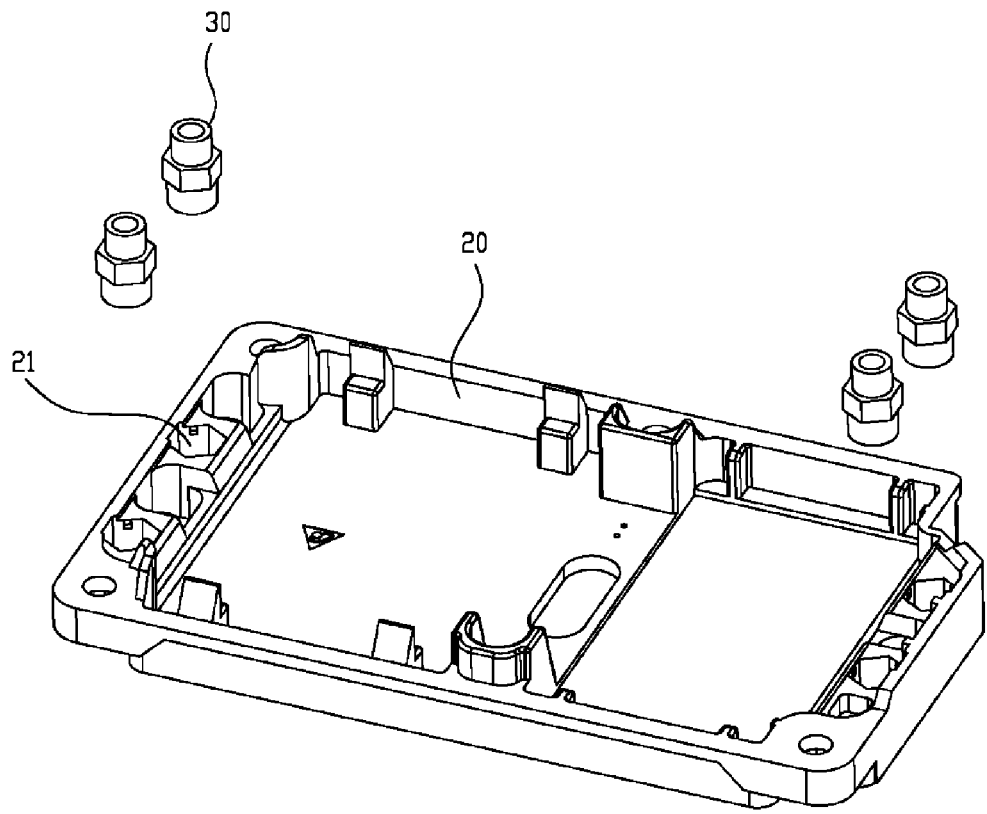
FIG. 6A shows the state of the terminal before inserted from the back surface of the base into the insertion hole in the base according to an embodiment of the invention.
Figure 6B:
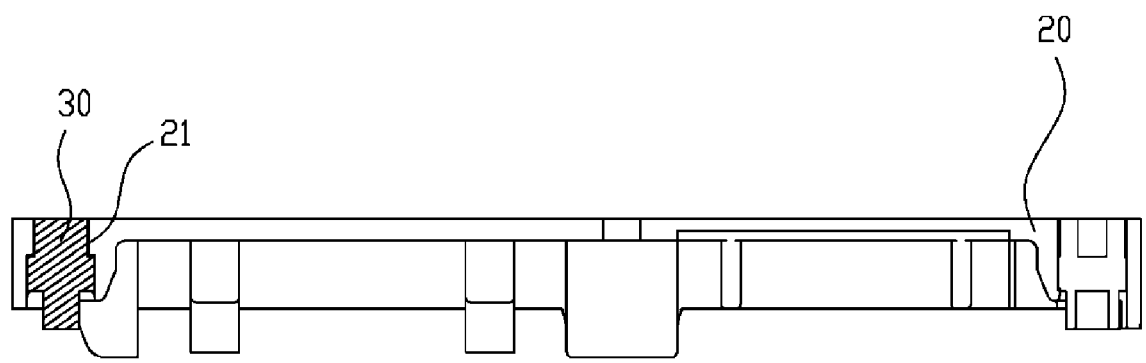
FIG. 6B shows the state of the terminal in FIG. 6A after inserted into the base.
Figure 7:
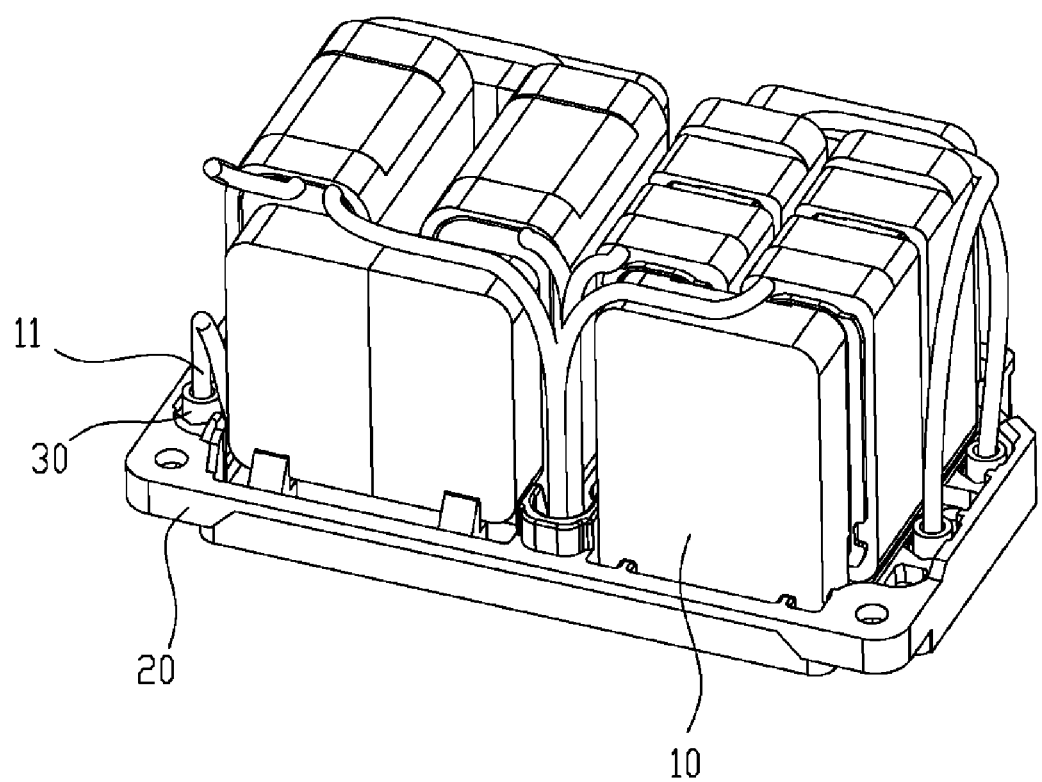
FIG. 7 is a perspective view showing the electronic component mounted onto the base according to an embodiment of the invention.
Figure 8A:
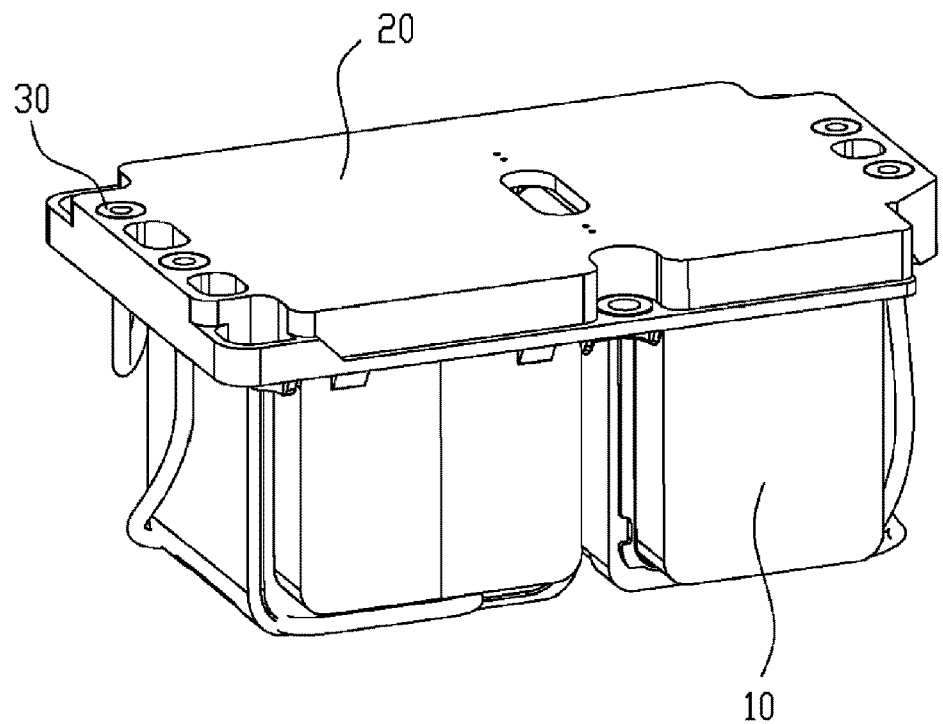
FIG. 8A is a front structural view showing the electronic component in FIG. 7 mounted onto the base.
Figure 8B:
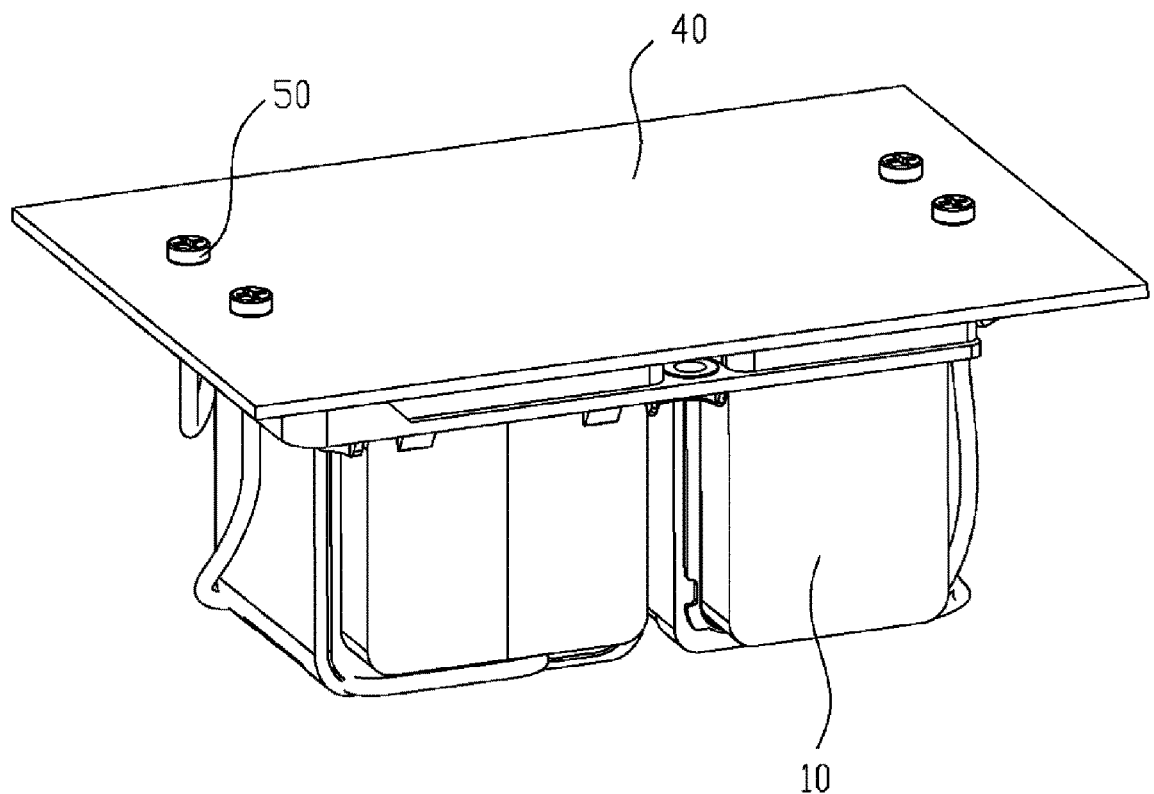
FIG. 8B is a perspective view showing the circuit board assembled with the electronic device and the base according to an embodiment of the invention.
Figure 8C:
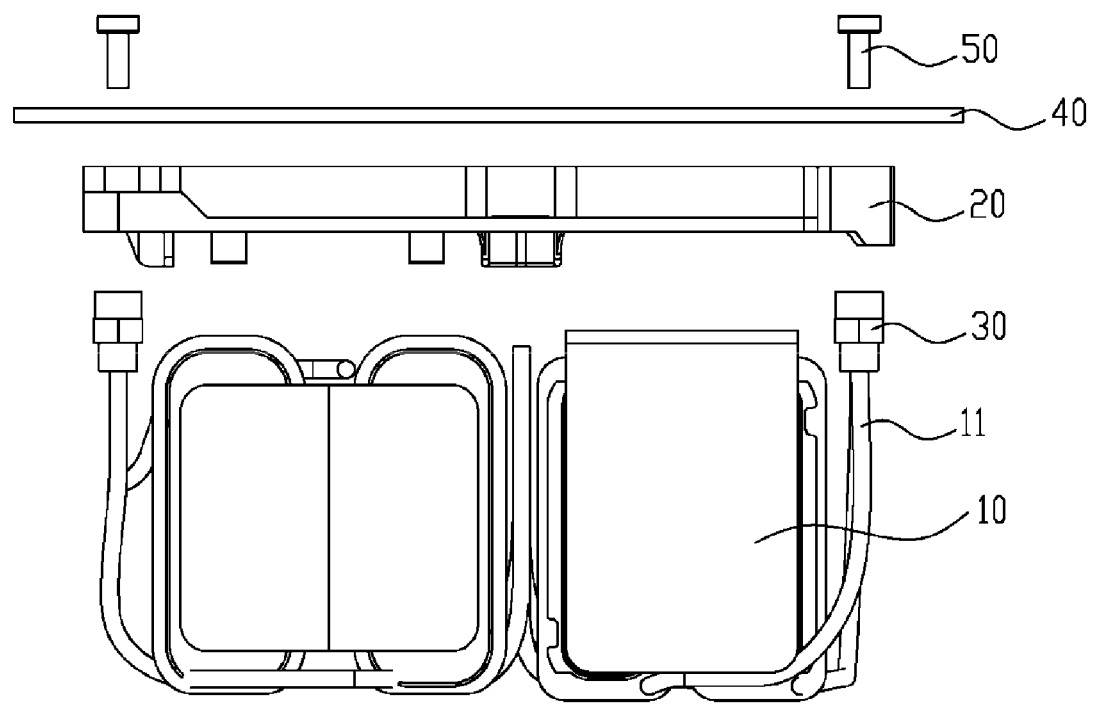
FIG. 8C is a view showing the assembled state of the electronic device according to an embodiment of the invention.

Referring to FIG. 2, during mounting, the direct plug-in terminal 30 of this embodiment may be directly inserted from the back surface of the base 20 into the insertion hole 21 of the base 20, as shown in FIG. 6A. After insertion, the terminal 30 is restricted and fixed in the insertion hole 21, as shown in FIG. 6B. The jump wire 11 of the electronic component 10 can be correspondingly inserted into the connecting part 31 of the terminal 30, and welded or pressure connected thereto, and the electronic component 10 can be mounted onto the base 20, as shown in FIG. 7. It can be understood that, in other embodiment, the jump wire 11 can be firstly connected to the connecting part 31 of the terminal 30, and then the terminal 30 together with the jump wire 11 can be entirely inserted into the insertion hole 21 of the base 20. However, the invention is not limited thereto. The structure of the assembly of the electronic component 10 and the base 20 is shown in FIG. 8A, wherein the terminal 30 connected with the jump wire 11 is restricted and fixed in the insertion hole 21 after being inserted thereinto. As shown in FIG. 8C, the base 20 can be fixed onto the circuit board 40 through threaded connection between the fixing members 50 and the fixing parts 33 of the terminals 30. The assembled electronic device is shown in FIG. 8B.

Figure 9A:
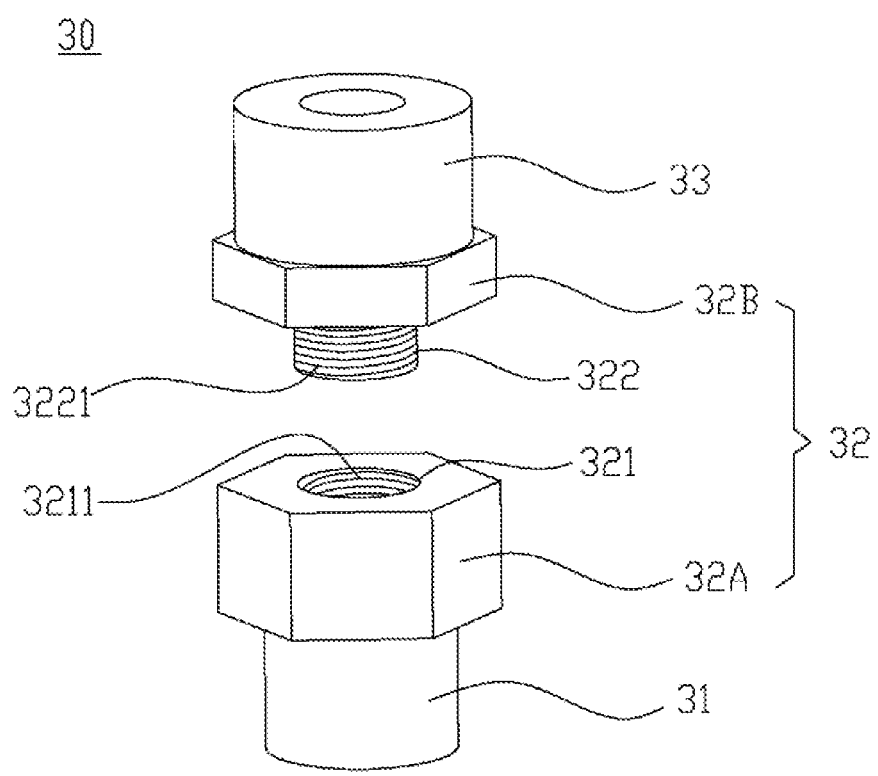
FIG. 9A is a perspective view showing the terminal according to a still another embodiment of the invention, where the terminal is a detachable structure.
Figure 9B:
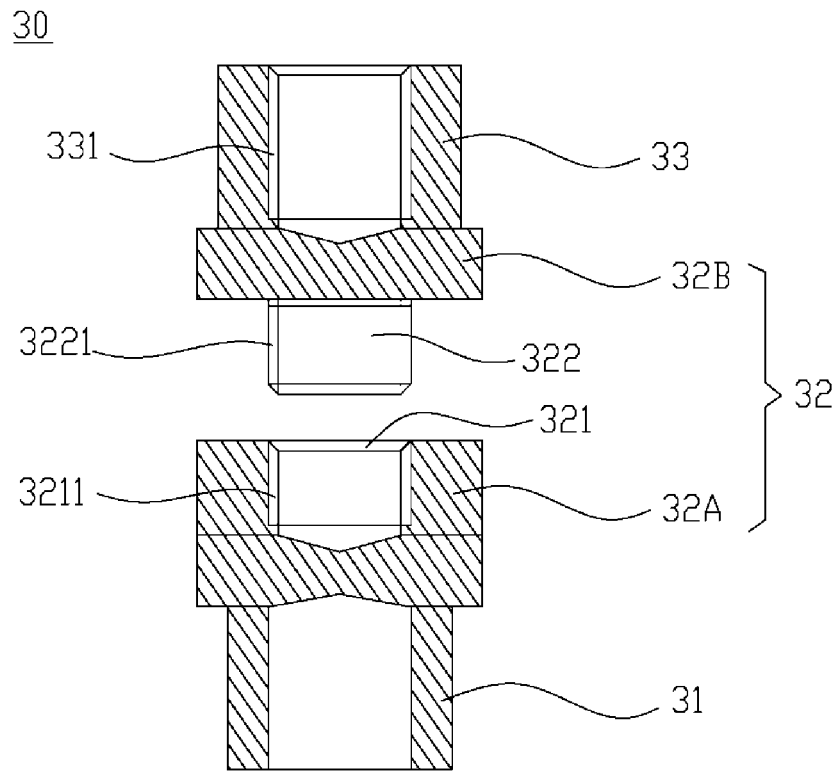
FIG. 9B is a sectional view of the terminal shown in FIG. 9A.

In an embodiment, as shown in FIGS. 9A and 9B, another direct plug-in terminal 30 is of a detachable structure. For example, the mounting part 32 can be consisted of a first sub-mounting part 32A and a second sub-mounting part 32B detachably connected with each other. The first sub-mounting part 32A is connected to the connecting part 31, and the second sub-mounting part 32B is connected to the fixing part 33. In this embodiment, the first sub-mounting part 32A includes a recess 321 having an internal thread 3211, and the second sub-mounting part 32B includes a projection 322 having an external thread 3221 suitable for engaging with the internal thread 3211, so that the detachable connection between the first and second sub-mounting part 32A and 32B can be realized by matching the recess 321 with the projection 322. Of course, in other embodiment, the projection 322 can be disposed on the first sub-mounting part 32A, and the recess 321 can be disposed on the second sub-mounting part 32B. In other words, the projection having the external thread can be disposed on one of the first and second sub-mounting parts, and the recess having the internal thread can be disposed on the other of the first and second sub-mounting parts correspondingly to the projection, such that the first sub-mounting part and the second sub-mounting part can be detachably connected with each other by matching the projection with the recess.

Figure 10:
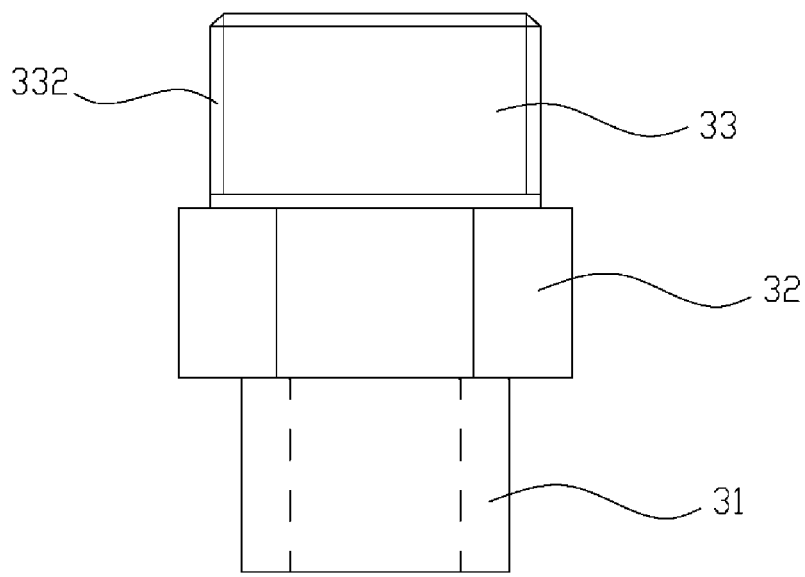
FIG. 10 is a view showing the terminal according to a yet another embodiment of the invention, where the fixing part of the terminal has an external thread.

In an embodiment, as shown in FIG. 10, according to a still further embodiment of the invention, the direct plug-in terminal 30 has a second external thread 332 on the fixing part 33, and the fixing member 50 (such as, nut, see FIG. 2) has a second internal thread (not shown) matching with the second external thread 332, such that the fixing part 33 can pass through the fixing holes 41 in the circuit board 40 and threadedly connected with the fixing member 50.

The direct plug-in terminal according to some embodiments of the invention can be rapidly and conveniently connected to the jump wire of the electronic component through the connecting part. Moreover, the direct plug-in terminal according to some embodiments of the invention can be conveniently and directly inserted into and mounted on the base of the electronic device, and can be threadedly connected to the fixing part of the terminal through the fixing members, and can conveniently fix the circuit board of the electronic device to the base. Thereby, the electronic device can be assembled more conveniently and rapidly, and occupy reduced space, thereby realizing the objective of reducing the volume of the electronic device.

Although several embodiments of the present invention have been described, the present invention may be used with other configurations. It will be appreciated by those skilled in the art, the present invention could have many other embodiments, and changes and modifications may be made thereto without departing from the invention in its broader aspects and as set forth in the following claims and equivalents thereof.

What is claimed is:

1. A terminal comprising a connecting part, a mounting part, and a fixing part arranged along an insertion direction, wherein the connecting part, the mounting part and the fixing part are connected in sequence along the insertion direction, and the mounting part is arranged between the connecting part and the fixing part,
   wherein the connecting part is adapted to be connected to a jump wire of an electronic component,
   the mounting part has an outer profile matching with at least a portion of an inner profile of an insertion hole in a base, for restricting displacement of the terminal after being inserted into the insertion hole, and
   the fixing part is adapted to be threadedly connected with a fixing member so as to connect the fixing part to a circuit board.

2. The terminal according to claim 1, wherein the electronic component is mounted on the base, and the base is mounted on the circuit board, wherein the connecting part, the mounting part, the fixing part, and the fixing member are made of conductive materials, and wherein the terminal electrically connects and fixes the jump wire to the circuit board.

3. The terminal according to claim 1, wherein the connecting part, the mounting part and the fixing part are formed as an integrated column structure.

4. The terminal according to claim 1, wherein the electronic component is a transformer, and the jump wire of the electronic component is a lead wire of the transformer.

5. The terminal according to claim 1, wherein the insertion hole comprises a connecting section, a mounting section, and a fixing section for accommodating the connecting part, the mounting part and the fixing part, respectively,
   wherein the connecting section has a first block suitable for being interfered with the mounting part to restrict the terminal inserted into the insertion hole from sliding out, the mounting section has a second block suitable for being interfered with the mounting part to restrict the terminal inserted into the insertion hole from passing through the insertion hole, and the outer profile of the mounting part matches with an inner profile of the mounting section of the insertion hole.

6. The terminal according to claim 5, wherein the first block has a chamfer at one end adjacent to an inlet of the insertion hole.

7. The terminal according to claim 1, wherein the outer profile of the mounting part has a larger size than that of outer profiles of the fixing part and the connecting part.

8. The terminal according to claim 1, wherein the outer profile of the mounting part is of a polygonal shape to restrict rotating displacement of the terminal inserted into the insertion hole.

9. The terminal according to claim 1, wherein the mounting part comprises a first sub-mounting part and a second sub-mounting part detachably connected with each other, wherein the first sub-mounting part is connected to the connecting part, and the second sub-mounting part is connected to the fixing part.

10. The terminal according to claim 9, wherein the first sub-mounting part and the second sub-mounting part are detachably connected with each other by matching a projection having an external thread with a recess having an internal thread, wherein the projection is disposed on one of the first sub-mounting part and the second sub-mounting part, and the recess is disposed on the other of the first sub-mounting part and the second sub-mounting part correspondingly to the projection.

11. The terminal according to claim 1, wherein the fixing part has a first internal thread, and the fixing member has a first external thread for matching with the first internal thread, the fixing member passes through a fixing hole in the circuit board and is connected with the fixing part by matching the first external thread with the first internal thread; or
wherein the fixing part has a second external thread, and the fixing member has a second internal thread for matching with the second external thread, the fixing part passes through a fixing hole in the circuit board and is connected with the fixing member by matching the second external thread with the second internal thread.

12. The terminal according to claim 1, wherein the jump wire is inserted into the connecting part from a bottom surface of the connecting part in a direction parallel to the insertion direction;
or the jump wire is inserted into the connecting part from a side surface of the connecting part in a direction perpendicular to the insertion direction.

13. The terminal according to claim 12, wherein the connecting part and the jump wire are welded or pressure connected with each other.

14. The terminal according to claim 13, wherein an outer profile of the connecting part is of round shape, and a sidewall of the connecting part is provided with a slot.

15. An electronic device, comprising
a base provided with at least one insertion hole;
an electronic component mounted on the base;
a circuit board provided with at least one fixing hole correspondingly to the at least one insertion hole;
at least one fixing member; and
at least one terminal directly inserted into the corresponding insertion hole and comprising a connecting part, a mounting part, and a fixing part arranged along an insertion direction, wherein the connecting part, the mounting part and the fixing part are connected in sequence along the insertion direction, and the mounting part is arranged between the connecting part and the fixing part, wherein the connecting part is adapted to be connected to a jump wire of the electronic component, the mounting part has an outer profile matching with at least a portion of an inner profile of the insertion hole in the base, for restricting displacement of the terminal after being inserted into the insertion hole, and the fixing part is adapted to be threadedly connected with the fixing member so as to connect the fixing part to the circuit board;
wherein one of the fixing member and the fixing part passes through the fixing hole in the circuit board, matches and is connected with the other one of the fixing member and the fixing part, so that the base is fixed to the circuit board to electrically connect and fix the jump wire of the electronic component to the circuit board through the terminal.

16. The electronic device according to claim 15, wherein the electronic component is mounted on the base, and the base is mounted on the circuit board, wherein the connecting part, the mounting part, the fixing part, and the fixing member are made of conductive materials, and wherein the terminal electrically connects and fixes the jump wire to the circuit board.

17. The electronic device according to claim 15, wherein the connecting part, the mounting part and the fixing part are formed as an integrated column structure.

18. The electronic device according to claim 15, wherein the electronic component is a transformer, and the jump wire of the electronic component is a lead wire of the transformer.

19. The electronic device according to claim 15, wherein the insertion hole comprises a connecting section, a mounting section, and a fixing section for accommodating the connecting part, the mounting part and the fixing part, respectively,
wherein the connecting section has a first block suitable for being interfered with the mounting part to restrict the terminal inserted into the insertion hole from sliding out, the mounting section has a second block suitable for being interfered with the mounting part to restrict the terminal inserted into the insertion hole from passing through the insertion hole, and the outer profile of the mounting part matches with an inner profile of the mounting section of the insertion hole;
wherein the first block has a chamfer at one end adjacent to an inlet of the insertion hole.

20. The electronic device according to claim 15, wherein the outer profile of the mounting part has a larger size than that of outer profiles of the fixing part and the connecting part;
wherein the outer profile of the mounting part is of a polygonal shape to restrict rotating displacement of the terminal inserted into the insertion hole.

* * * * *